US011996344B2

(12) United States Patent
Omae et al.

(10) Patent No.: US 11,996,344 B2
(45) Date of Patent: May 28, 2024

(54) SEMICONDUCTOR DEVICE

(71) Applicant: DENSO CORPORATION, Kariya (JP)

(72) Inventors: Shoichiro Omae, Kariya (JP); Hiroshi Ishino, Kariya (JP)

(73) Assignee: DENSO CORPORATION, Kariya (JP)

( * ) Notice: Subject to any disclaimer, the term of this patent is extended or adjusted under 35 U.S.C. 154(b) by 464 days.

(21) Appl. No.: 17/469,091

(22) Filed: Sep. 8, 2021

(65) Prior Publication Data

US 2021/0407881 A1    Dec. 30, 2021

Related U.S. Application Data

(63) Continuation of application No. PCT/JP2020/005569, filed on Feb. 13, 2020.

(30) Foreign Application Priority Data

Mar. 11, 2019  (JP) ................................ 2019-043884

(51) Int. Cl.
| | |
|---|---|
| *H01L 23/367* | (2006.01) |
| *H01L 23/00* | (2006.01) |
| *H01L 23/31* | (2006.01) |
| *H01L 23/495* | (2006.01) |

(52) U.S. Cl.
CPC ........ *H01L 23/367* (2013.01); *H01L 23/3107* (2013.01); *H01L 23/49517* (2013.01); *H01L 23/49537* (2013.01); *H01L 23/49562* (2013.01); *H01L 24/40* (2013.01);
(Continued)

(58) Field of Classification Search
CPC .. H01L 23/367; H01L 23/49517; H01L 24/44
See application file for complete search history.

(56) References Cited

U.S. PATENT DOCUMENTS

| | | | | |
|---|---|---|---|---|
| 6,845,012 | B2 * | 1/2005 | Ohkouchi | ............. H01L 25/117 |
| | | | | 257/E23.098 |
| 7,242,582 | B2 * | 7/2007 | Kurauchi | ................ H01L 24/33 |
| | | | | 257/E23.092 |
| 9,892,993 | B2 * | 2/2018 | Ikeda | ...................... H01L 23/00 |

(Continued)

FOREIGN PATENT DOCUMENTS

| | | |
|---|---|---|
| JP | 2015-082614 A | 4/2015 |
| WO | 2020/184052 A1 | 9/2020 |
| WO | 2020/184053 A1 | 9/2020 |

*Primary Examiner* — Eugene Lee
(74) *Attorney, Agent, or Firm* — POSZ LAW GROUP, PLC

(57) ABSTRACT

A semiconductor device includes: a semiconductor element having a first main electrode and a second main electrode; a first heat dissipation member and a second heat dissipation member; and a lead frame including a first main terminal connected to the first heat dissipation member and a second main terminal connected to the second main electrode. The second main terminal includes a connection portion connected with the second main electrode, a facing portion extending from the connection portion and facing the first heat dissipation member, and a non-facing portion. The non-facing portion and the first main terminal are arranged in a direction orthogonal to a thickness direction. A side surface of the first main terminal and a side surface of the non-facing portion of the second main terminal face each other.

7 Claims, 14 Drawing Sheets

(52) U.S. Cl.
CPC ............. *H01L 2924/1305* (2013.01); *H01L 2924/13091* (2013.01); *H01L 2924/181* (2013.01)

(56) References Cited

U.S. PATENT DOCUMENTS

| | | | |
|---|---|---|---|
| 10,002,821 B1* | 6/2018 | Hoegerl | H01L 23/051 |
| 10,777,488 B2* | 9/2020 | Tsuchimochi | H01L 23/49562 |
| 10,811,345 B2* | 10/2020 | Muto | H01L 23/3107 |
| 11,380,656 B2* | 7/2022 | Ishino | H01L 24/48 |
| 11,456,238 B2* | 9/2022 | Kamiya | H01L 25/18 |
| 11,887,905 B2* | 1/2024 | Yamada | H01L 23/49537 |
| 2007/0216013 A1* | 9/2007 | Funakoshi | H01L 24/40 257/691 |
| 2010/0238627 A1* | 9/2010 | Shinohara | H01L 25/072 361/688 |
| 2012/0001308 A1 | 1/2012 | Fukutani et al. | |
| 2012/0228757 A1* | 9/2012 | Kitami | H01L 23/36 257/713 |
| 2013/0267064 A1* | 10/2013 | Ikeda | H01L 24/80 438/109 |
| 2018/0013355 A1 | 1/2018 | Tokuyama et al. | |
| 2021/0407875 A1* | 12/2021 | Miwa | H01L 23/48 |

\* cited by examiner

US 11,996,344 B2

SEMICONDUCTOR DEVICE

CROSS REFERENCE TO RELATED APPLICATIONS

The present application is a continuation application of International Patent Application No. PCT/JP2020/005569 filed on Feb. 13, 2020, which designated the U.S. and claims the benefit of priority from Japanese Patent Application No. 2019-043884 filed on Mar. 11, 2019. The entire disclosures of all of the above applications are incorporated herein by reference.

TECHNICAL FIELD

The present disclosure relates to a semiconductor device.

BACKGROUND

There has been known a semiconductor device including a semiconductor element having multiple main electrodes, multiple heat dissipation members placed so as to sandwich the semiconductor element, and multiple main terminals electrically connected to the main electrodes, respectively.

SUMMARY

The present disclosure provides a semiconductor device including: a semiconductor element having a first main electrode and a second main electrode; a first heat dissipation member and a second heat dissipation member; and a lead frame including a first main terminal connected to the first heat dissipation member and a second main terminal connected to the second main electrode. The second main terminal includes a connection portion connected with the second main electrode, a facing portion extending from the connection portion and facing the first heat dissipation member, and a non-facing portion. The non-facing portion and the first main terminal are arranged in a direction orthogonal to a thickness direction. A side surface of the first main terminal and a side surface of the non-facing portion of the second main terminal face each other.

BRIEF DESCRIPTION OF DRAWINGS

Objects, features and advantages of the present disclosure will become apparent from the following detailed description made with reference to the accompanying drawings. In the drawings.

DETAILED DESCRIPTION

Figure 1:
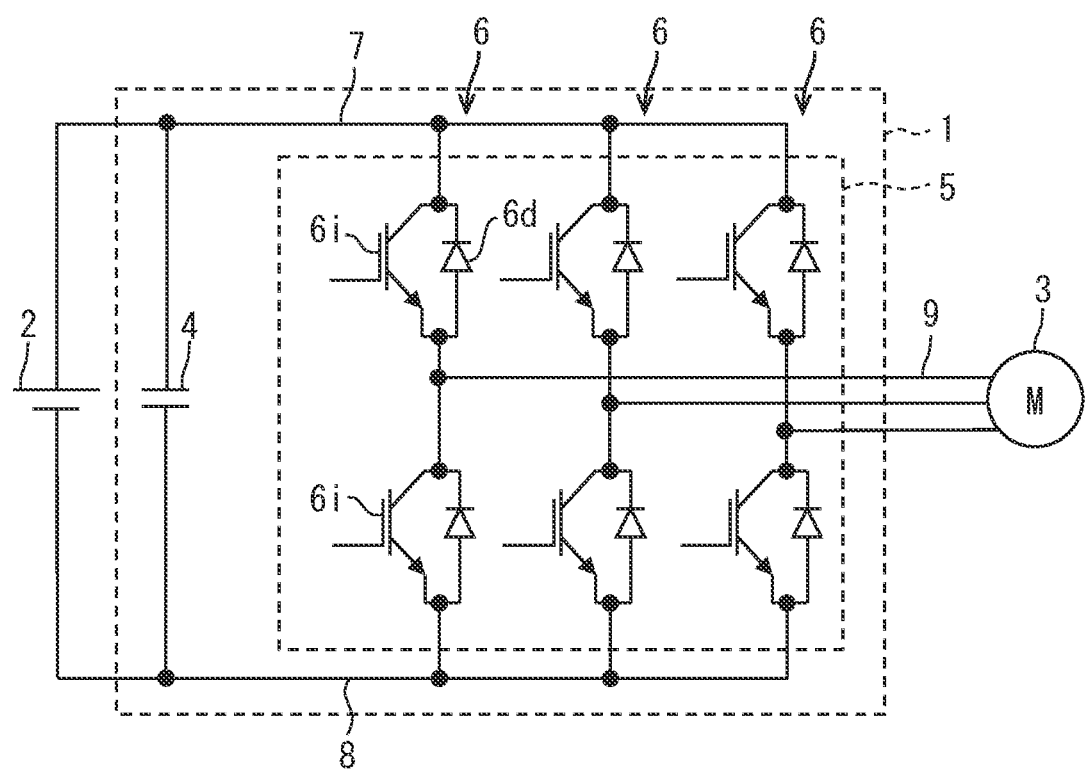
FIG. 1 is a diagram showing a schematic configuration of an electric power conversion device to which a semiconductor device according to a first embodiment is applied.

A semiconductor device according to an example includes a semiconductor element having a first main electrode and a second main electrode, a heat dissipation member placed so as to sandwich the semiconductor element, and main terminals electrically connected to corresponding main electrodes, respectively.

The semiconductor device includes, as the heat dissipation member, a first heat dissipation member placed close to the first main electrode and a second heat dissipation member placed close to the second main electrode. The semiconductor device includes, as the main terminal, a first main terminal electrically connected to the first main electrode and a second main terminal electrically connected to the second main electrode.

In the semiconductor device described above, the first main terminal extends from the first heat dissipation member, and the second main terminal extends from the second heat dissipation member. The first heat dissipation member is connected to the first main electrode, and the second heat dissipation member is connected to the second main electrode via a terminal. Between the first heat dissipation member and the second heat dissipation member, the semiconductor element and the terminal are interposed. Further, the semiconductor device includes one first main terminal and one second main terminal. It is required to further reduce the inductance.

A semiconductor device according to an aspect of the present disclosure includes: a semiconductor element having one surface and a back surface opposite to the one surface in a thickness direction of the semiconductor element, the semiconductor element including a first main electrode placed on the one surface and a second main electrode placed on the back surface; a first heat dissipation member and a second heat dissipation member placed to sandwich the semiconductor element, the first heat dissipation member placed close to the one surface and connected to the first main electrode, the second heat dissipation member placed close to the back surface; and a lead frame including at least one first main terminal electrically connected to the first heat dissipation member and a second main terminal connected to the second main electrode.

The second main terminal includes a connection portion, a facing portion, and at least one non-facing portion. The connection portion is connected with the second main electrode. The facing portion extends from the connection portion, has a first end continuous from the connection portion and a second end continuous from the at least one non-facing portion, and faces the first heat dissipation member. The at least one non-facing portion and the at least one first main terminal are arranged in a direction orthogonal to the thickness direction. The second heat dissipation member is connected to the semiconductor element via the second main terminal. In the lead frame, the at least one first main terminal includes multiple first main terminals or the at least one non-facing portion of the second main terminal includes multiple non-facing portions. The at least one first main terminal and the at least one non-facing portion of the second main terminal are alternately arranged in such a manner that a side surface of one of the at least one first main terminal faces a side surface of adjacent one of the at least one non-facing portion of the second main terminal to form multiple pairs of the side surfaces that face each other.

In the semiconductor device according to the above aspect, the first main terminal and the second main terminal are provided as members different from the first heat dissipation member and the second heat dissipation member. The second main terminal is placed between the second heat dissipation member and the semiconductor element, and is connected to the second electrode. As the portion that faces and has the same potential as that of the second main electrode, the facing portion of the second main terminal is closest. The first main terminal and the non-facing portion of the second main terminal are alternately placed so that the side surfaces face each other. Multiple pairs of side surfaces of the first main terminal and the non-facing portion of the second main terminal are formed. As the result, it is possible to provide the semiconductor device capable of reducing the inductance.

Hereinafter, multiple embodiments will be described with reference to the drawings. In the embodiments, functionally and/or structurally corresponding parts are denoted by the same reference numerals. In the following description, a thickness direction of a semiconductor element is shown as a Z direction and a direction orthogonal to the Z direction is shown as an X direction. A direction orthogonal to both of the Z direction and the X direction is shown as a Y direction. Unless otherwise specified, a shape along an XY plane defined by the X direction and the Y direction is a planar shape.

First Embodiment

First, an electric power conversion device including a semiconductor device will be described with reference to FIG. 1.

<Schematic Configuration of Electric Power Conversion Device>

An electric power conversion device 1 shown in FIG. 1 is mounted on, for example, an electric vehicle or a hybrid vehicle. The electric power conversion device 1 converts a DC voltage supplied from a DC (direct current) power source 2 mounted on the vehicle into three-phase AC and outputs it to a three-phase AC type motor 3. The motor 3 functions as a travel driving source of the vehicle. The electric power conversion device 1 can also convert an electric power generated by the motor 3 into a DC and charge the DC power source 2. The motor 3 having a power generation function may be referred to as a motor generator. The electric power conversion device 1 is capable of bidirectional power conversion.

The electric power conversion device 1 includes a smoothing capacitor 4 and an inverter 5 as a power converter. A positive electrode terminal of the smoothing capacitor 4 is connected to a positive electrode of the DC power source 2, which is a high potential side electrode of the DC power source 2. A negative electrode terminal of the smoothing capacitor 4 is connected to a negative electrode of the DC power source 2, which is a low potential side electrode of the DC power source 2. The inverter 5 converts the input DC electric power into a three-phase AC having a predetermined frequency, and outputs the three-phase AC to the motor 3. The inverter 5 converts the AC electric power generated by the motor 3 into the DC electric power. The inverter 5 corresponds to a DC-AC converter.

The inverter 5 includes upper-lower arm circuits 6 for three phases. In the upper-lower arm circuit 6 of each phase, two arms are connected in series between a high potential power source line 7 and a low potential power source line 8. The high potential power source line 7 is a power source line on a positive electrode side, and the low potential power source line 8 is a power source line on a negative electrode side. In the upper-lower arm circuit 6 of each phase, a connection point between the upper arm and the lower arm is connected to an output line 9 to the motor 3.

In this embodiment, an n-channel type insulated gate bipolar transistor 6i (hereinafter referred to as an IGBT 6i) is adopted as a switching element constituting each arm. FWDs 6d as freewheel diodes are connected in reverse parallel to each IGBT 61. The upper-lower arm circuits 6 for one phase are configured to have two IGBTs 6i. In the upper arm, collector electrodes of the IGBTs 6i are electrically connected to the high potential power source line 7. In the lower arm, emitter electrodes of the IGBTs 6i are electrically connected to the low potential power source line 8. The emitter electrodes of the IGBTs 6i in the upper arm and the collector electrodes of the IGBTs 6i in the lower arm are connected to each other.

In addition to the smoothing capacitor 4 and the inverter 5 described above, the electric power conversion device 1 may include a converter which is a power converter different from the inverter 5, a drive circuit for the switching element constituting the inverter 5 and the converter, and the like. The converter is a DC-DC converter that converts a DC voltage into the DC voltage having a different value.

<Semiconductor Device>

Figure 2:
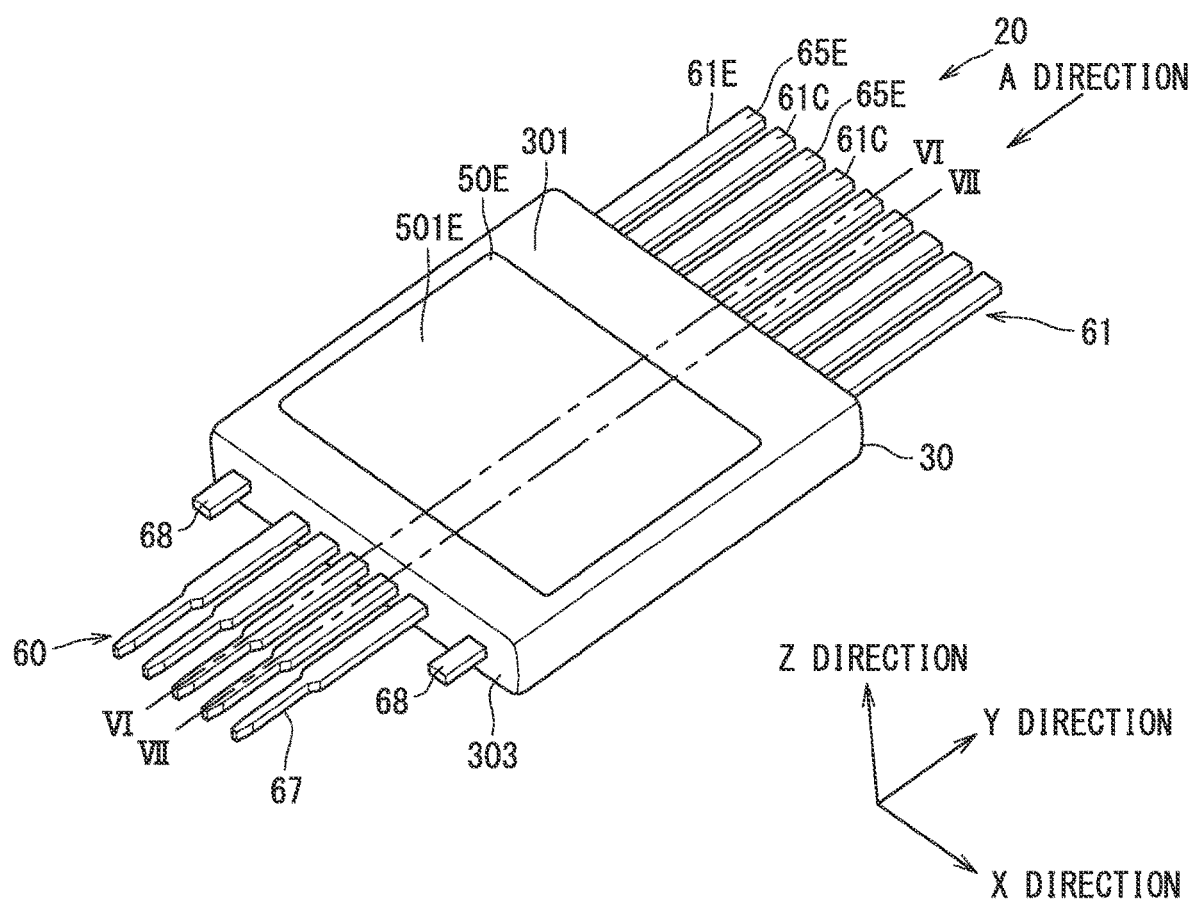
FIG. 2 is a perspective view showing a semiconductor device.
Figure 3:
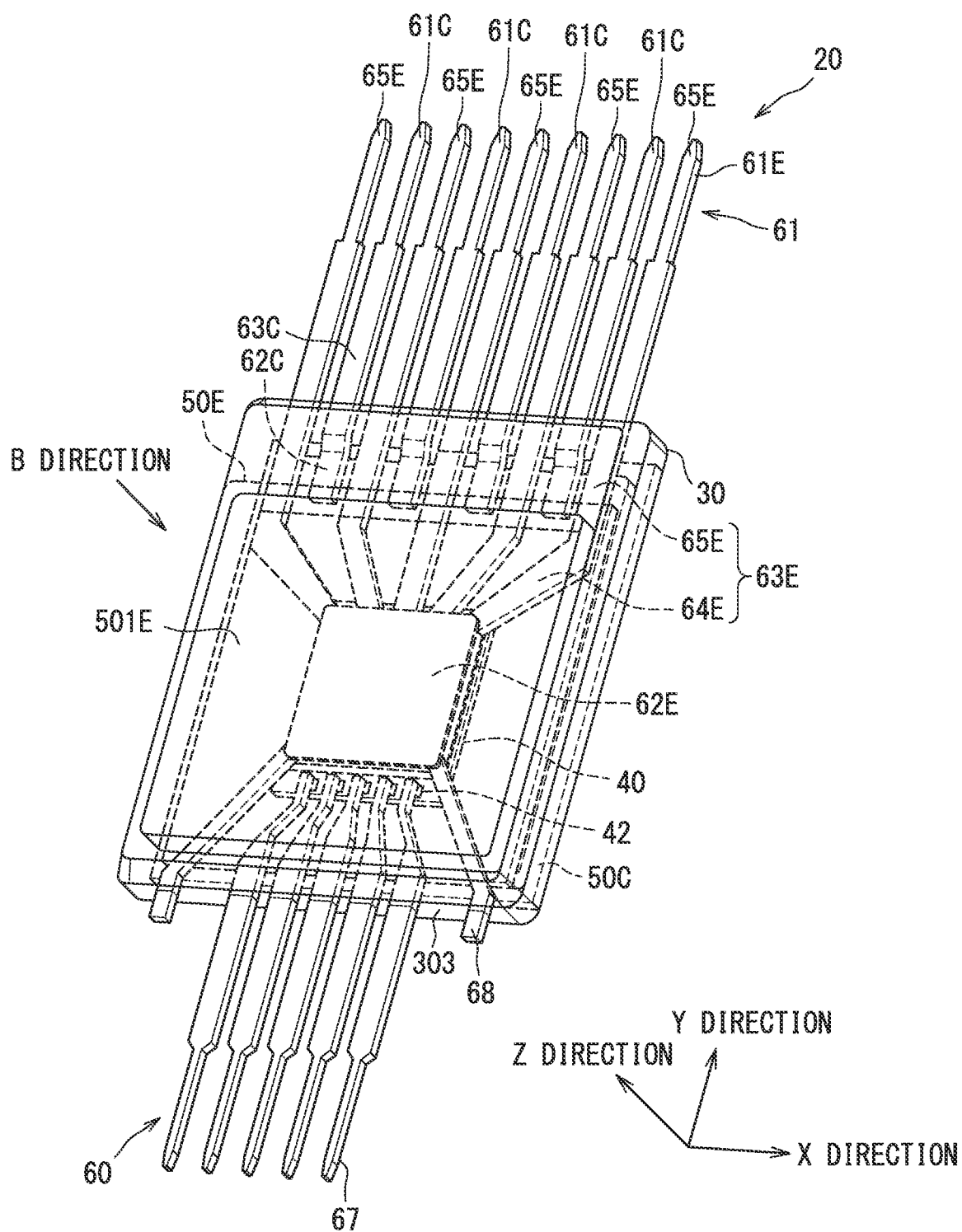
FIG. 3 is a perspective view showing elements inside a sealing resin body.
Figure 4:
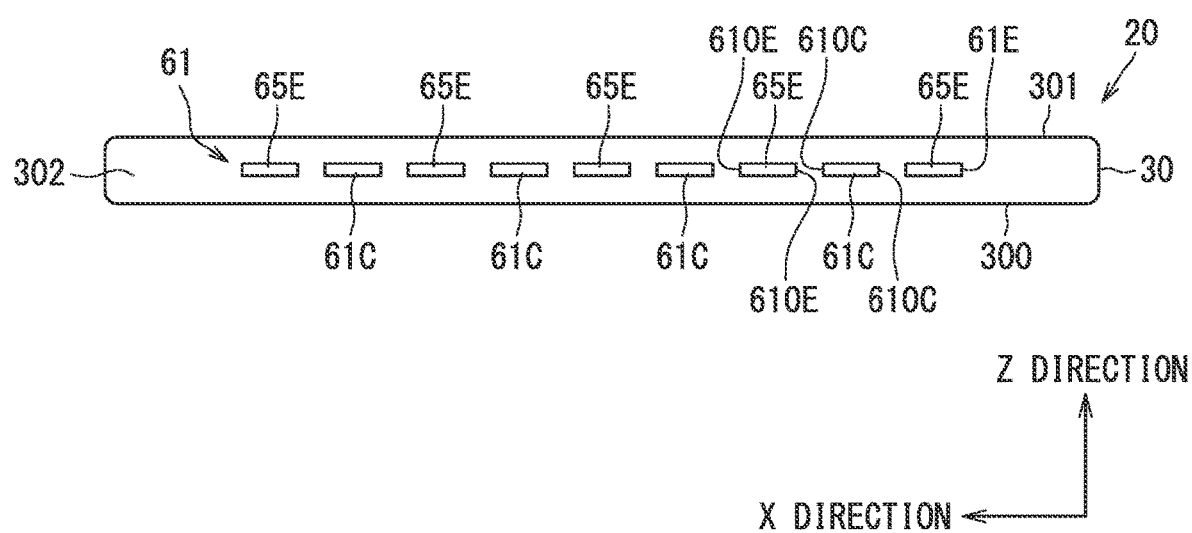
FIG. 4 is a plan view of FIG. 2 as seen from an A direction.
Figure 5:
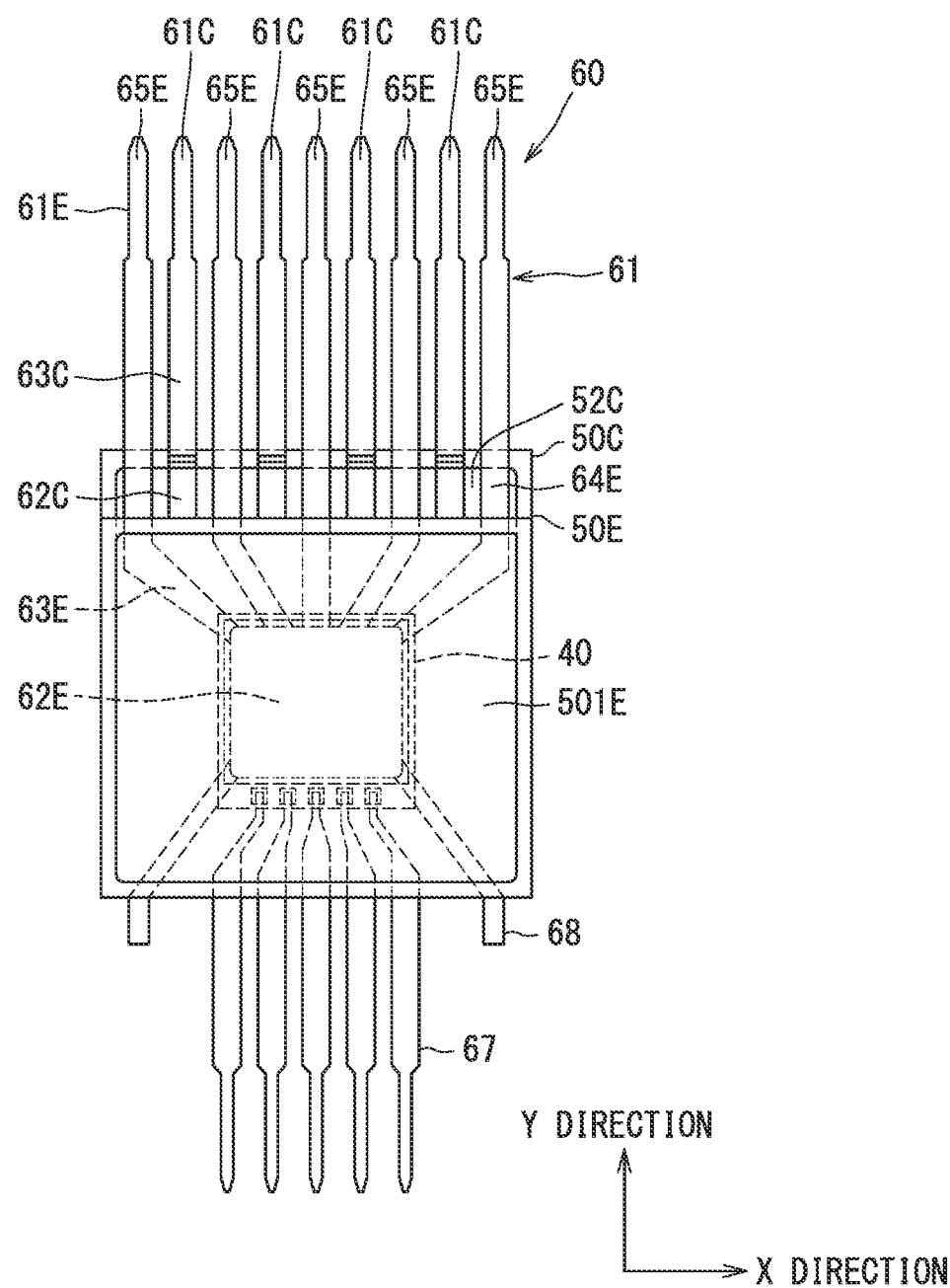
FIG. 5 is a plan view of FIG. 3 as seen from a B direction.
Figure 6:
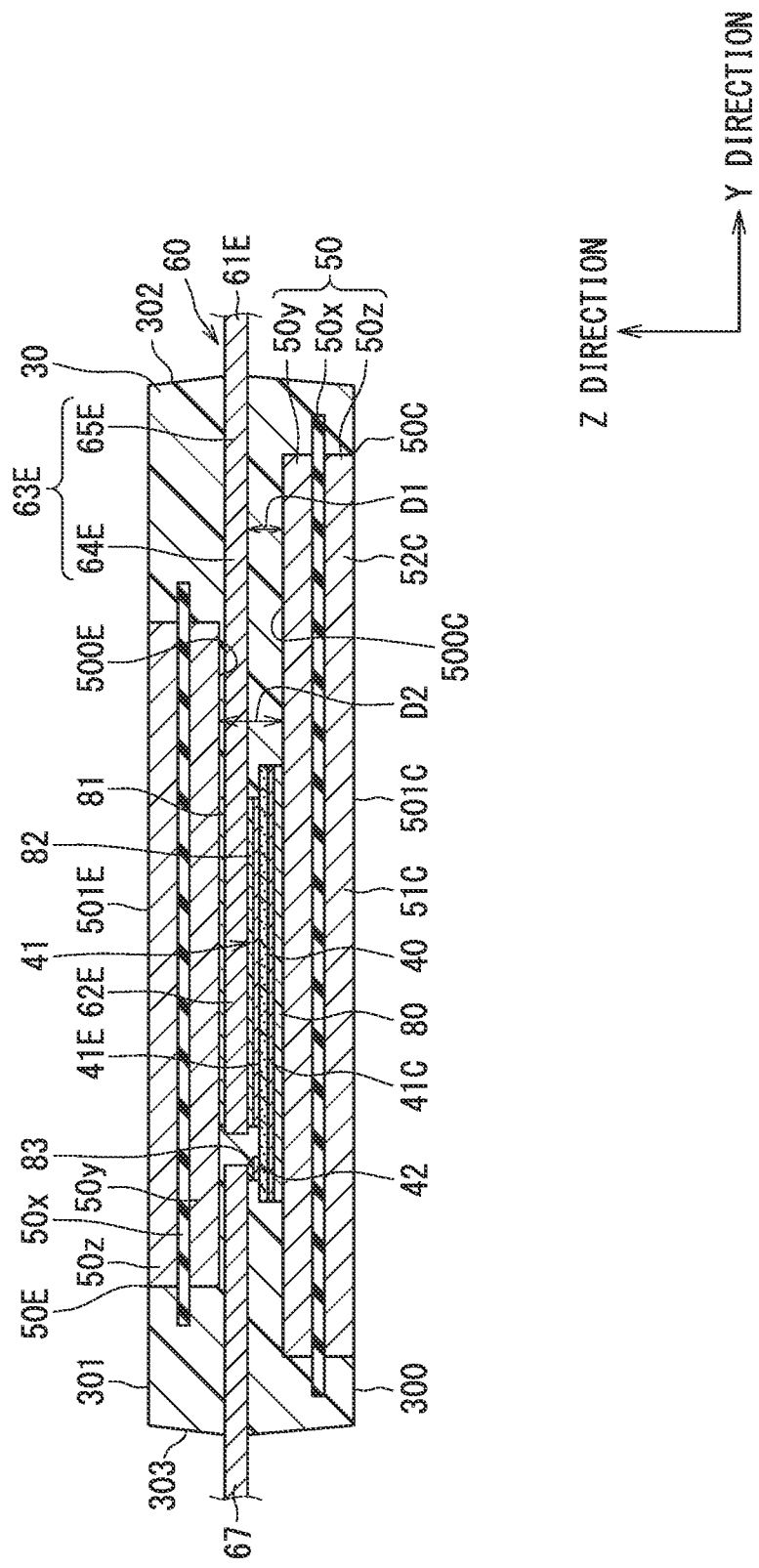
FIG. 6 is a cross-sectional view of the semiconductor device taken along a line VI-VI in FIG. 2.
Figure 7:
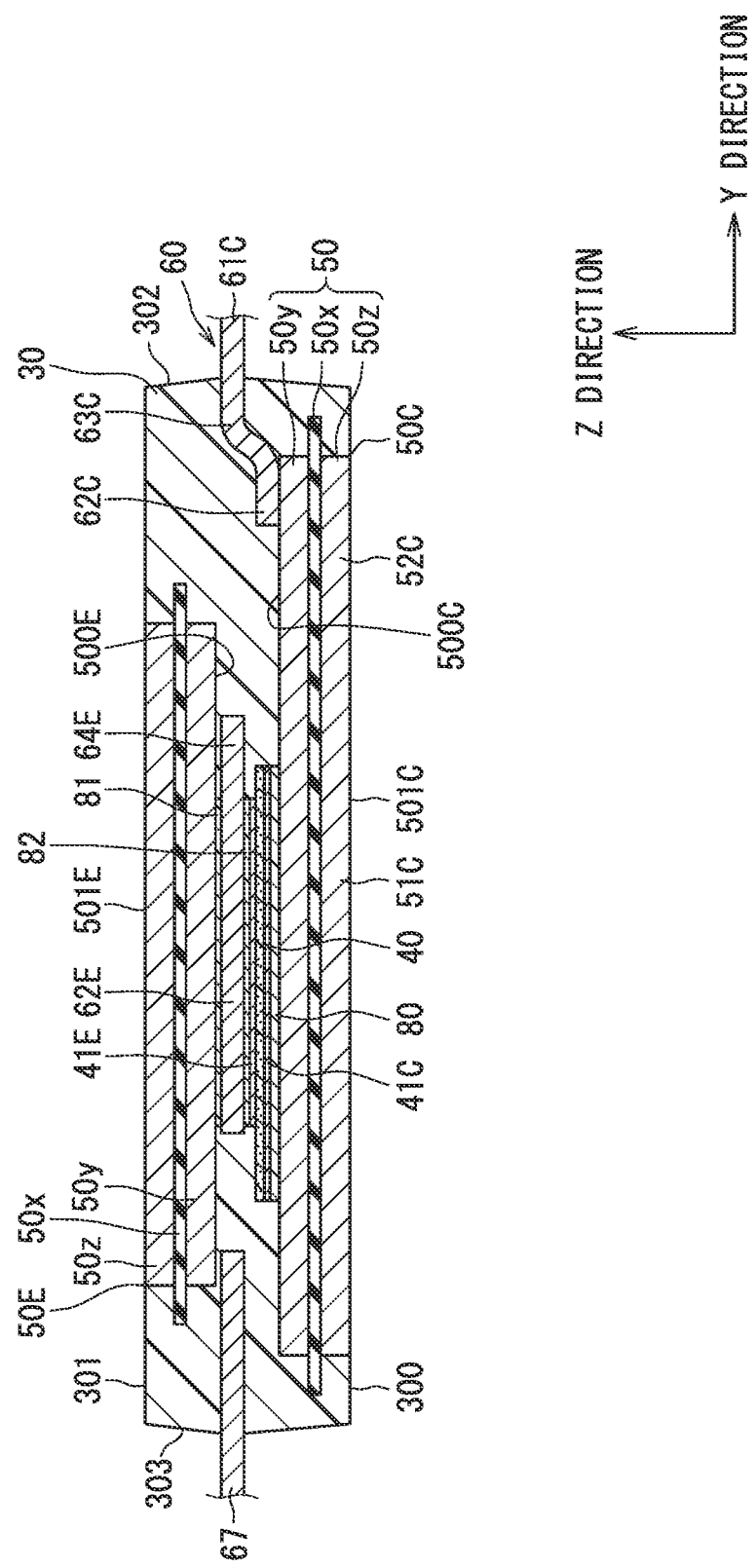
FIG. 7 is a cross-sectional view taken along a line VII-VII in FIG. 2.
Figure 8:
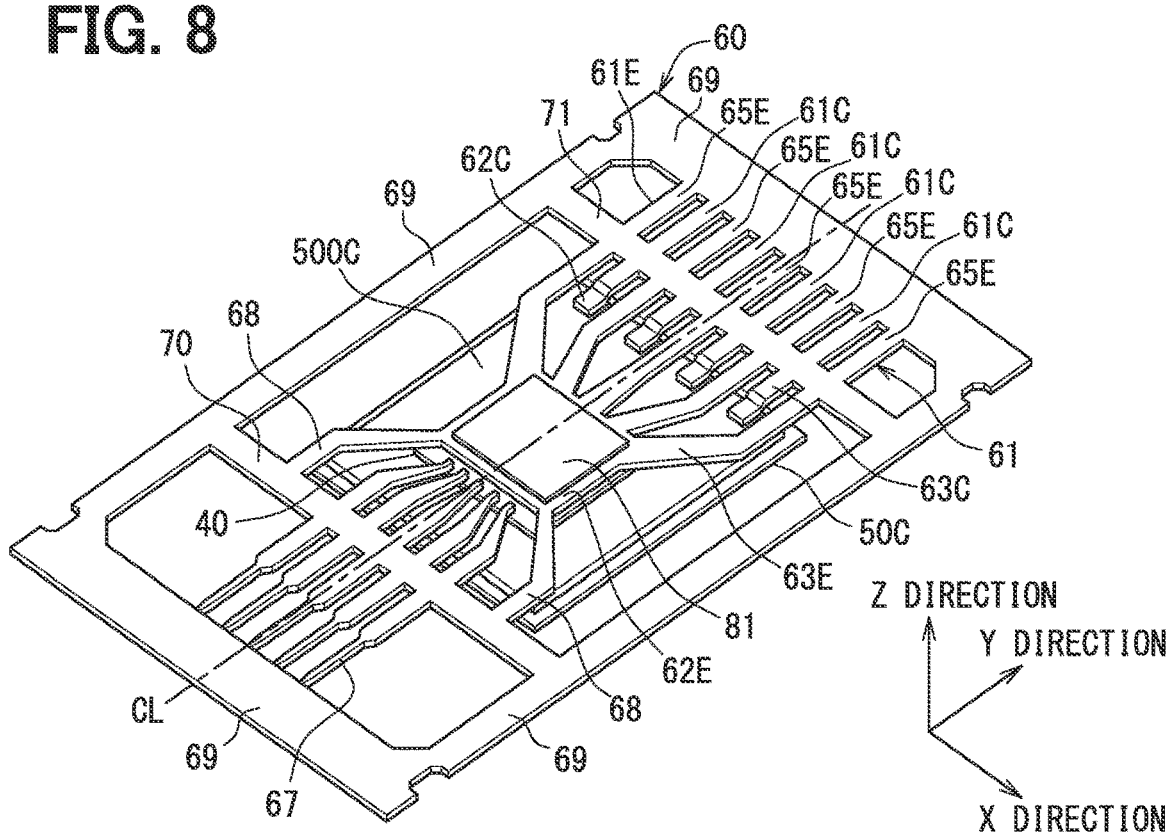
FIG. 8 is a perspective view showing a connection state of a lead frame.
Figure 9:
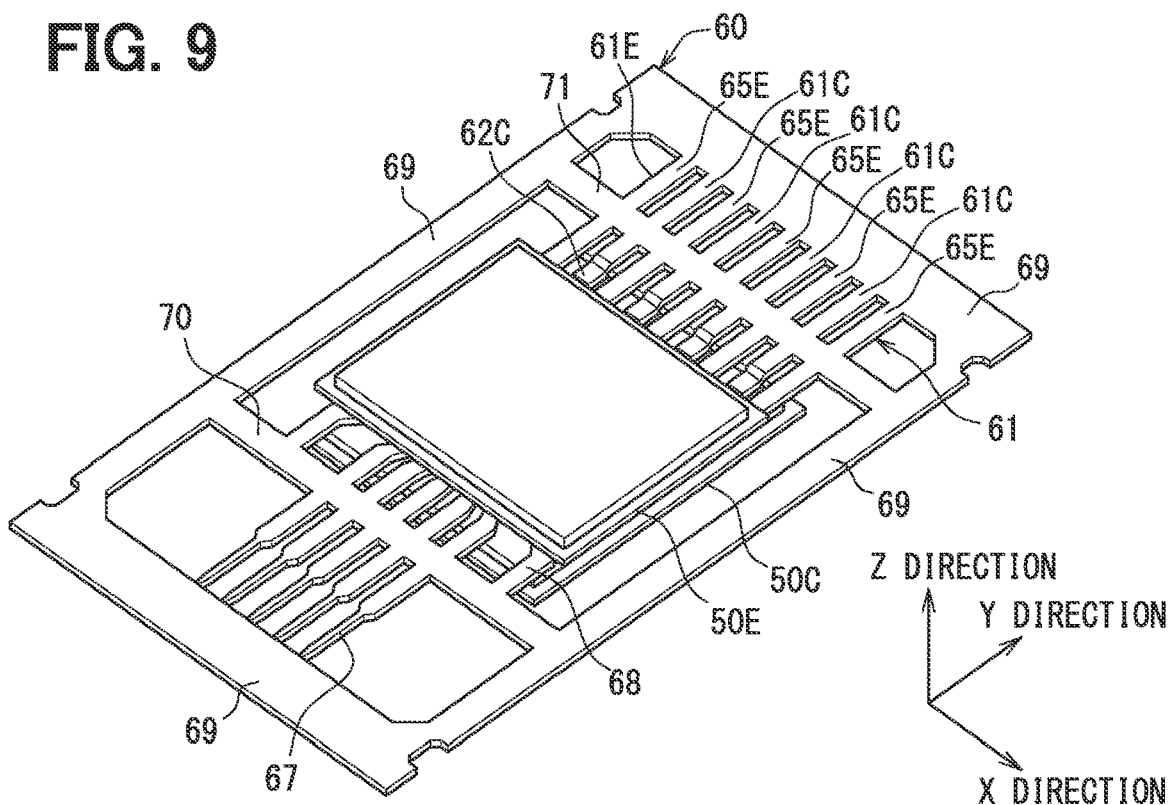
FIG. 9 is a perspective view showing a positional relationship between each heat sink and a lead frame.

As shown in FIGS. 2 to 9, a semiconductor device 20 includes a sealing resin body 30, a semiconductor element 40, a heat sink 50, and a lead frame 60 including a main terminal 61 and a signal terminal 67. FIG. 3 shows elements in the sealing resin body 30 of FIG. 2. In FIG. 5, for convenience, the sealing resin body 30 is omitted. FIG. 8 shows a connection state of the lead frame 60, specifically, a connection state between the semiconductor element 40 and a heat sink 50C. FIG. 9 shows a positional relationship between each heat sink 50 and the lead frame 60. FIG. 8 and FIG. 9 show the lead frame 60 before a tie bar is cut.

The sealing resin body 30 seals a part of other elements constituting the semiconductor device 20. The other elements are exposed to the outside of the sealing resin body 30. The sealing resin body 30 seals, for example, the semiconductor element 40. The sealing resin body 30 seals a connection portion formed between other elements constituting the semiconductor device 20. The sealing resin body 30 seals the connection portion between the semiconductor element 40 and the lead frame 60. The sealing resin body 30 seals the connection portion between the heat sink 50 and the lead frame 60. The sealing resin body 30 may be referred to as a mold resin.

The sealing resin body 30 is made of, for example, an epoxy resin. The sealing resin body 30 is formed by, for example, a transfer molding method. As shown in FIG. 2, FIG. 3, and FIG. 4, the sealing resin body 30 has one surface 300 and a back surface 301 opposite to the one surface 300 in the Z direction. The one surface 300 and the back surface 301 are, for example, flat surfaces. The sealing resin body 30 has a lateral surface connecting the one surface 300 and the back surface 301. In the present embodiment, the sealing resin body 30 has a substantially rectangular shape in a plan view. The sealing resin body 30 has a side surface 302 from which the main terminal 61 protrudes to the outside and a side surface 303 from which the signal terminal 67 protrudes to the outside. The side surface 303 is a surface opposite to the side surface 302 in the Y direction.

In the semiconductor element 40, the element is formed on a semiconductor substrate such as Si, SiC, or GaN. The semiconductor device 20 includes at least one semiconductor element 40. In the present embodiment, the IGBT 6i and FWD 6d are formed on the semiconductor substrate constituting the semiconductor element 40. As described above, RC (Reverse Conducting)-IGBT is adopted as the semiconductor element 40. The semiconductor element 40 constitutes one of the above-described arms. The semiconductor element 40 is sometimes referred to as a semiconductor chip.

The semiconductor element 40 has a vertical structure so that the main current flows in the Z direction. Although not shown, the semiconductor element 40 has a gate electrode. The gate electrode has, for example, a trench structure. As shown in FIGS. 6 and 7, the semiconductor element 40 has main electrodes 41 on both sides thereof in the thickness direction, that is, in the Z direction. A main current flows between the main electrodes 41. Specifically, as the main electrodes 41, a collector electrode 41C is provided on one surface side, and an emitter electrode 41E is provided on the back surface side, which is the opposite surface to the one surface side. The collector electrode 41C also serves as a cathode electrode of the FWD 6d, and the emitter electrode 41E also serves as an anode electrode of the FWD 6d. The collector electrode 41C is formed on almost the entire surface of the one side. The emitter electrode 41E is formed on a part of the back surface. The collector electrode 41C corresponds to a first main electrode, and the emitter electrode 41E corresponds to a second main electrode.

As shown in FIG. 3 and FIG. 6, the semiconductor element 40 has a pad 42, which is an electrode for signals, on the forming surface of the emitter electrode 41E. The pad 42 is formed at a position different from that of the emitter electrode 41E. The pad 42 is electrically isolated from the emitter electrode 41E. The semiconductor element 40 has a substantially rectangular shape in a plane. The pad 42 is formed at an end on the side opposite to the formation region of the emitter electrode 41E in the Y direction.

The semiconductor element 40 has, for example, five pads 42. Specifically, the pad 42 has a gate electrode pad, a potential detection pad of the emitter electrode 41E, a current sense pad, and a temperature detection pad of the semiconductor element 40. The pad 42 for temperature detection includes an anode potential pad of a temperature sensing diode, which is a temperature detecting element, and a cathode potential pad. The five pads 42 are formed side by side in the X direction.

An Al-based material can be used as the configuration material of the electrode such as the main electrode 41 and the pad 42. When jointing by solder or the like, it may be preferable to include Cu as a material. For example, AlCuSi can be used.

The heat sink 50 is the heat dissipation member placed so as to sandwich the semiconductor element 40 in the Z direction. The heat sink 50 functions to radiate (dissipate) the heat generated by the semiconductor element 40. A pair of the heat sinks 50 are placed so as to sandwich the semiconductor element 40 in the Z direction. The semiconductor device 20 has, as the pair of heat sinks 50, the heat sink 50C placed close to the collector electrode 41C and a heat sink 50E placed close to the emitter electrode 41E. The heat sink 50C corresponds to a first heat dissipation member, and the heat sink 50E corresponds to a second heat dissipation member.

The heat sinks 50C and 50E are provided so as to accommodate the semiconductor element 40 inside in a plan view from the Z direction. The heat sink 50C has a mounting surface 500C close to the semiconductor element 40 and a heat dissipation surface 501C opposite to the mounting surface 500C in the Z direction. The heat sink 50E has a mounting surface 500E close to the semiconductor element 40 and a heat dissipation surface 501E opposite to a mounting surface 500E in the Z direction. The mounting surfaces 500C and 500E face each other in the Z direction. The mounting surfaces 500C and 500E are substantially parallel to each other. The mounting surface 500C corresponds to a facing surface of the first heat dissipation member.

In the present embodiment, the heat sinks 50C and 50E have a substantially rectangular shape in a plan view. The lengths of the heat sinks 50C and 50E in the X direction are substantially same. The length of the heat sink 50C in the Y direction is longer than that of the heat sink 50E. As shown in FIG. 3, FIG. 5, and FIG. 6, the heat sink 50C straddles the heat sink 50E in the Y direction. The heat sink 50C has an overlapping portion 51C and a non-overlapping portion 52C. The overlapping portion 51C is a portion overlapping with the heat sink 50E in the plan view from the Z direction. The overlapping portion 51C is an area facing the mounting surface 500E of the heat sink 50E in the Z direction. The non-overlapping portion 52C is continuous from the overlapping portion 51C at a position close to the main terminal 61 in the Y direction. The non-overlapping portion 52C is a portion that does not overlap with the heat sink 50E.

The collector electrode 41C is connected to the mounting surface 500C of the heat sink 50C via a bonding member 80. The collector electrode 41C is connected to the overlapping portion 51C of the heat sink 50C. The heat sink 50C is connected to the main terminal 61 (main terminal 61C) corresponding to the collector electrode 41C. The main terminal 61C is connected to the non-overlapping portion 52C of the heat sink 50C. The main terminal 61C is electrically connected to the collector electrode 41C via the heat sink 50C. The heat sink 50C functions as a wiring connecting the collector electrode 41C and the main terminal 61C.

The mounting surface 500E of the heat sink 50E is connected to the main terminal 61 (main terminal 61E) corresponding to the emitter electrode 41E via a joint member 81. The main terminal 61E is connected to the emitter electrode 41E via a joint member 82. The heat sink 50E is connected to the emitter electrode 41E via the joint members 81 and 82 and the main terminal 61E. The main terminal 61E is electrically connected to the emitter electrode 41E via no heat sink 50E.

At least a part of each of the heat sinks 50C and 50E is sealed by the sealing resin body 30. In this embodiment, the heat dissipation surface 501C of the heat sink 50C is exposed from the sealing resin body 30. The heat dissipation surface 501C is substantially flush with the one surface 300. The portion of the surface of the heat sink 50C other than the connection portion with the collector electrode 41C, the heat dissipation surface 501C, and the connection portion with the main terminal 61C is covered with the sealing resin body 30. Similarly, the heat dissipation surface 501E of the heat sink 50E is exposed from the sealing resin body 30. The heat dissipation surface 501E is substantially flush with the back surface 301. The portion of the surface of the heat sink 50E other than the connection portion with the main terminal 61E and the heat dissipation surface 501E is covered with the sealing resin body 30.

As the heat sink 50, for example, a metal plate or a composite material of a metal body and an insulator can be used. The composite material is, for example, a DBC (Direct Bonded Copper) substrate. The same type of materials may be used for the heat sink 50C and the heat sink 50E, or different materials may be used. In this embodiment, as shown in FIG. 3, FIG. 6, FIG. 7 and the like, DBC substrates are used as the heat sinks 50C and 50E.

The heat sink 50 has an insulator 50$x$ and metal bodies 50$y$ and 50$z$ arranged so as to sandwich the insulator 50$x$. The insulator 50$x$ is a ceramic substrate. The metal bodies 50$y$ and 50$z$ are formed by material including, for example, Cu. The metal bodies 50$y$ and 50$z$ are directly bonded to the insulator 50$x$. The heat sink 50 is stacked in the order of the metal body 50$y$, the insulator 50$x$, and the metal body 50$z$ from the side of the semiconductor element 40. The heat sink 50 has a three-layer structure.

The planar shapes and sizes of the metal bodies 50$y$ and 50$z$ are substantially same as each other. The planar shape of the insulator 50$x$, which is the intermediate layer, is similar to that of the metal bodies 50$y$ and 50$z$. The size of the insulator 50$c$ is larger than that of the metal bodies 50$y$ and 50$z$. The insulator 50$x$ extends to the outside of the metal bodies 50$y$ and 50$z$ all around. In the heat sinks 50C and 50E, one surface of the metal body 50$y$ forms the mounting surfaces 500C and 500E. In the heat sinks 50C and 50E, one surface of the metal body 50$z$ forms the heat dissipation surfaces 501C and 501E.

The lead frame 60 includes an external connection terminal. The external connection terminal electrically connects the above-described arm to the outside of the semiconductor device 20. The outside of the semiconductor device 20 is, for example, another semiconductor device 20, the smoothing capacitor 4, or the like. The lead frame 60 includes, as the external connection terminal, the main terminal 61 and the signal terminal 67. The lead frame 60 is configured as a member different from the heat sink 50. The lead frame 60 is placed between the heat sinks 50C and 50E in the Z direction. The lead frame 60 is formed by processing a metal plate made of Cu or the like by a press or the like.

The main terminal 61 is an external connection terminal through which the main current flows. The lead frame 60 is provided with multiple main terminals 61. The main terminal 61 is electrically connected to the corresponding main electrode 41. The semiconductor device 20 has, as the main terminals 61, the main terminal 61C electrically connected to the collector electrode 41C and the main terminal 61E electrically connected to the emitter electrode 41E. The main terminal 610 corresponds to a first main terminal, and the main terminal 61E corresponds to a second main terminal. The main terminal 61C may be also referred to as a collector terminal. The main terminal 61E may be also referred to as an emitter terminal.

An electrical connection portion with the main electrode 41 in the main terminal 61 is sealed by the sealing resin body 30. Each of the main terminals 61 extends from the electrical connection portion with the main electrode 41 in the Y direction and extends away from the semiconductor element 40. All the main terminals 61 project outward from the side surface 302 of the sealing resin body 30.

As shown in FIG. 3, FIG. 5, and FIG. 7, the main terminal 61C has a connection portion 62C and an extension portion 63C. The connection portion 62C is a connection portion of the main terminal 61C to the heat sink 50C. The main terminal 61C may be connected to the heat sink 50C via a connection member such as solder. The main terminal 61C is directly connected to the heat sink 50C by ultrasonic bonding, friction stir welding, laser welding or the like. The extension portion 63C is a portion extending from the connection portion 62C. The extension portion 63C is integrally connected to the connection portion 62C.

As shown in FIG. 3, FIG. 5, and FIG. 6, the main terminal 61E has a connection portion 62E and an extension portion 63E. The connection portion 62E is a connection portion of the main terminal 61E to the emitter electrode 41E. As described above, the connection portion 62E of the main terminal 61E is connected to the emitter electrode 41E via the joint member 82. The connection portion 62E is a portion overlapping with the emitter electrode 41E in the plan view from the Z direction. The main terminal 61E is connected to the heat sink 50E including the connection portion 62E. The joint member 81 is placed on one surface of the connection portion 62E, and the joint member 82 is placed on a surface opposite to the one surface. In the plan view from the Z direction, at least a part of the joint members 81 and 82 overlap each other.

The extension portion 63E is a portion extending from the connection portion 62E. The extension portion 63E is integrally connected to the connection portion 62E. The extension portion 63C has a facing portion 64E and a non-facing portion 65E. The facing portion 64E is a portion facing the heat sink 50C. The facing portion 64E faces the mounting surface 500C of the heat sink 50C in the Z direction. One end of the facing portion 64E is connected to the connection portion 62E, and the other end is connected to the non-facing portion 65E.

The non-facing portion 65E faces a portion facing the heat sink 50C. The non-facing portion 65E extends from the facing portion 64E and extends away from the semiconductor element 40. The non-facing portion 65E and the extension portion 63C of the main terminal 61C are arranged in one direction orthogonal to the Z direction. The extension portion 63C of the main terminal 61C and the non-facing portion 65E of the main terminal 61E are placed so that side surfaces 610C and 610E face each other. A part of the extension portion 63C and a part of the non-facing portion 65E are provided as a connection portion with the outside. The extension portion 63C and the non-facing portion 65E may be also referred to as a terminal portion. At least, the number of main terminals 61C in the lead frame 60 or the number of non-facing portions 65E in the lead frame 60 is two or more.

The main terminal 61C and the non-facing portion 65E are alternately placed in the arrangement direction. The alternate arrangement is arrangement in which the main terminal 61C and the main terminal 61E are adjacent to each other in the arrangement direction. The plate surfaces of the main terminal 61C and the non-facing portion 65E do not face each other, and the side surfaces 610C and 610E face each other. Due to the alternate arrangement, the lead frame 60 has multiple sets of facing side surfaces 610C and 610E. At least a part of the side surfaces 610C and 610E may face each other in the plate thickness direction of the main terminal 61. For example, the side surfaces may be placed so as to shift in the plate thickness direction. Preferably, one of side surfaces 710C and 710E facing each other is placed to face the other one over the entire area in the thickness direction.

The minimum alternate configuration is a combination of two main terminals 61C and one non-facing portion 65E or a combination of one main terminal 61C and two non-facing portions 65E. For example, in the case of two main terminals 61C and one non-facing portion 65E, in the arrangement direction, the main terminal 61C, the non-facing portion 65E, and the main terminal 61C are placed in this order. Two sets of side surfaces 610C and 610E facing each other are formed.

In the present embodiment, the lead frame 60 includes four main terminals 61C and five non-facing portions 65E. The plate thickness of the lead frame 60 is made substantially uniform over the entire area. The multiple main terminals 61C have substantially the same structure as each other. The connection portion 62C of the main terminal 61C is ultrasonically bonded to the non-overlapping portion 52C of the mounting surface 500C of the heat sink 50C. The connection portion 62C is connected to the metal body 50y constituting the heat sink 50C. The connection portion 62C is connected to the mounting surface 500C near the one end in the Y direction.

The extension portion 63C extends along the Y direction in the plan view in Z direction. That is, the main terminal 61C extends along the Y direction in the same plan view. The main terminal 61C extends with a substantially constant width. The extension portion 63C has a bent portion. The extension portion 63C projects from the sealing resin body 30 at a position closer to the mounting surface 500E than the connection portion 62C in the Z direction. The main terminal 61C has a crank shape in the YZ plane.

The main terminal 61E has only one connection portion 62E. The main terminal 61E has a common connection portion 62E integrally provided with multiple non-facing portions 65E. The lead frame 60 has five extension portions 63E. Each extension portion 63E in the non-facing portion 65E extends from one common connection portion 62E. In the extension portion 63E, a plate surface extending in substantially parallel to the mounting surfaces 500C and 500E faces the mounting surfaces 500C and 500E. Multiple facing portions 64E are arranged in the X direction while being separated from each other. The facing portion 64E extends while having a predetermined gap with the mounting surface 500E of the heat sink 50E. The sealing resin body 30 is interposed between the facing portion 64E and the mounting surface 500E.

The multiple non-facing portions 65E have the substantially same structure. The non-facing portion 65E extends with a substantially constant width in the Y direction. The width of the non-facing portion 65E is almost the same as the width of the main terminal 61E. The non-facing portion 65E and the main terminal 61 are alternately placed in the X direction. The non-facing portions 65E are placed at both ends in the arrangement direction. The main terminal 61C and the non-facing portion 65E are placed at substantially the same positions in the Z direction and located closer to the tip side than to the bent portion of the main terminal 61C. Almost the entire surfaces of the side surfaces 610C and 610E face each other. As shown in FIG. 4, the lead frame 60 has eight sets of side surfaces 610C and 610E facing each other. The facing distance of the side surfaces 610C and 610E, in other words, a pitch with the main terminal 61 and the non-facing portion 65E (second main terminal 61E) is constant.

As shown in FIG. 8, the main terminals 61C and 61E are arranged line-symmetrically with respect to the center line CL passing through the element center of the semiconductor element 40 in the X direction. The element center is the center of the semiconductor element 40 when there is one semiconductor element 40 as in the present embodiment. When there are two semiconductor elements 40, for example, it is the central position between the centers in the alignment direction of the two semiconductor elements 40. The center line CL is a virtual line orthogonal to the X direction and passing through the element center.

The signal terminal 67 is electrically connected to the pad 42 of the corresponding semiconductor element 40. The lead frame 60 has multiple signal terminals 67. The signal terminal 67 is connected to the pad 42 inside the sealing resin body 30. The five signal terminals 67 connected to the pads 42 extend in the Y direction away from the semiconductor element 40, respectively. The signal terminals 67 are arranged in the X direction. All the signal terminals 67 project outward from the side surface 303 of the sealing resin body 30.

In this embodiment, as shown in FIG. 6, the signal terminal 67 is connected to the pad 42 via a joint member 83. As the above joint members 80, 81, 82, and 83, a conductive paste including solder, Ag, or the like can be used. In this embodiment, solder is used as the joint members 80, 81, 82, and 83.

The lead frame 60 has a suspension lead 68. The lead frame 60 shown in FIG. 8 and FIG. 9 has an outer peripheral frame 69 and tie bars 70 and 71 before the tie bar cut. The outer peripheral frame 69 may be also referred to as an outer peripheral frame body. The tie bar 70 extends in the X direction, and the both ends are connected to the outer peripheral frame 69. The multiple signal terminals 67 are supported by the outer peripheral frame 69 with use of the tie bar 70. One end of the suspension lead 68 is connected to the connection portion 62E, and the other end is connected to the tie bar 70. Two suspension leads 68 are placed so as to sandwich the signal terminal 67 in the X direction.

The tie bar is placed on the opposite side to the tie bar 70 with respect to the semiconductor element 40 so that the semiconductor element 40 is paced between the tie bar 71 and the tie bar 70 in the Y direction. The tie bar 71 extends in the X direction, and the both ends are connected to the outer peripheral frame 69. The multiple main terminals 61C are supported by the outer peripheral frame 69 with use of the tie bar 71. The tie bar 71 is connected to the extension portion 63C. The non-facing portions 65E are supported by the outer peripheral frame 69 with use of the tie bar 71. The tips of the extension portions 63C and 63E of the main terminals 61C and 61E are connected to the outer peripheral frame 69 in the Y direction. The connection portion 62E is connected to the tie bar 70 via the suspension lead 68, and connected to the tie bar 71 via the extension portion 63E.

After the molding of the sealing resin body 30, the unnecessary portion of the lead frame 60 such as the outer peripheral frame 69 and the tie bars 70 and 71 are removed. Thereby, in the semiconductor device 20, the main terminals 61C and 61E are electrically separated. Further, the multiple signal terminals 67 are electrically separated. The semiconductor device 20 does not include, as the lead frame 60, the outer peripheral frame 69 and the tie bars 70 and 71, and includes the main terminal 61, the signal terminal 67, and the suspension lead 68.

In the semiconductor device 10 configured as described above, the sealing resin body 30 integrally seals the semiconductor element 40 and a part of each of the heat sinks 50, a part of each of the main terminals 61, and a part of the signal terminals 67. That is, elements configuring one arm are sealed. Such a semiconductor device 20 may be referred to as a one-in-one package.

The heat dissipation surface 501C of the heat sink 50C is substantially flush with the one surface 300 of the sealing resin body 30. The heat dissipation surface 501E of the heat sink 50E is substantially flush with the back surface 301 of the sealing resin body 30. The semiconductor device 20 has a double-sided heat dissipation structure in which the heat dissipation surfaces 501C and 501E are both exposed from the sealing resin body 30. The semiconductor device 20 can be formed, for example, by cutting the heat sinks 50 together with the sealing resin body 30. Further, the sealing resin body 30 may be molded with the heat dissipation surfaces 501C and 501E in contact with the cavity wall surface of the mold for molding the sealing resin body 30.

Overview of First Embodiment

Figure 10:
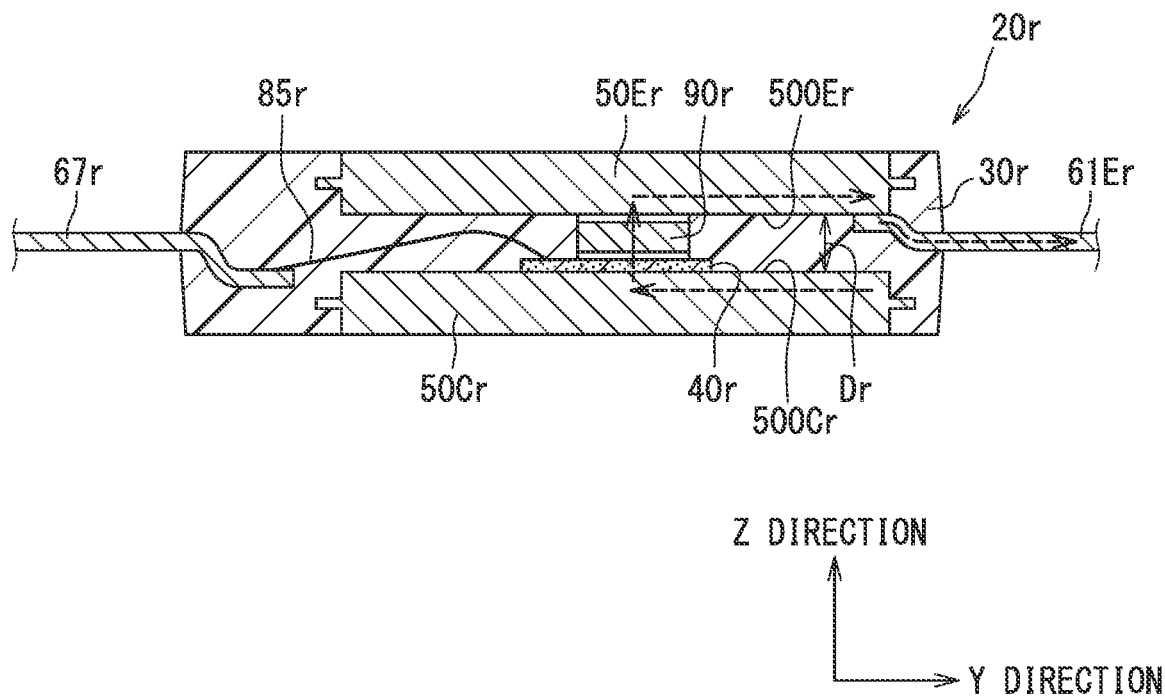
FIG. 10 is a cross-sectional view showing a comparative example.

FIG. 10 is a comparative example of a semiconductor device. In the comparative example, the related elements are denoted by adding "r" to the tails of the reference numerals in the present embodiment. As shown in FIG. 10, a semiconductor device 20r of the comparative example includes a bonding wire 85r and a terminal 90r. A signal terminal 67r is connected to a pad (not shown) of a semiconductor element 40r via the bonding wire 85r. The terminal 90r is interposed between an emitter electrode (not shown) of the semiconductor element 40r and a heat sink 50Er. The terminal 90r functions as a spacer for securing the height of the bonding wire 85r.

The heat sink 50Er is thermally and electrically connected to the emitter electrode via the terminal 90r. The main terminal 61E is connected to the heat sink 50Er. The main terminal 61Er is connected to the heat sink 50Er, for example. The heat sink 50Er has a function of dissipating heat generated by the semiconductor element 40, and a function of wiring that connects the emitter electrode and the main terminal 61Er.

In such a configuration, as the same potential portion as the emitter electrode, mainly, the heat sink 50Er faces the heat sink 50Cr having the same potential as the collector electrode. A mounting surface 500Er of the heat sink 50Er faces most of the mounting surface 500Cr of the heat sink 50Cr. As shown by a broken line arrow in FIG. 10, the direction of the main current is substantially opposite in the heat sinks 50Cr and 50Er. As a result, the magnetic fluxes generated when the main current flows cancel each other, and the inductance can be reduced. A facing distance Dr contributing to the reduction of the inductance is a distance between the mounting surfaces 500Cr and 500Er.

Figure 11:
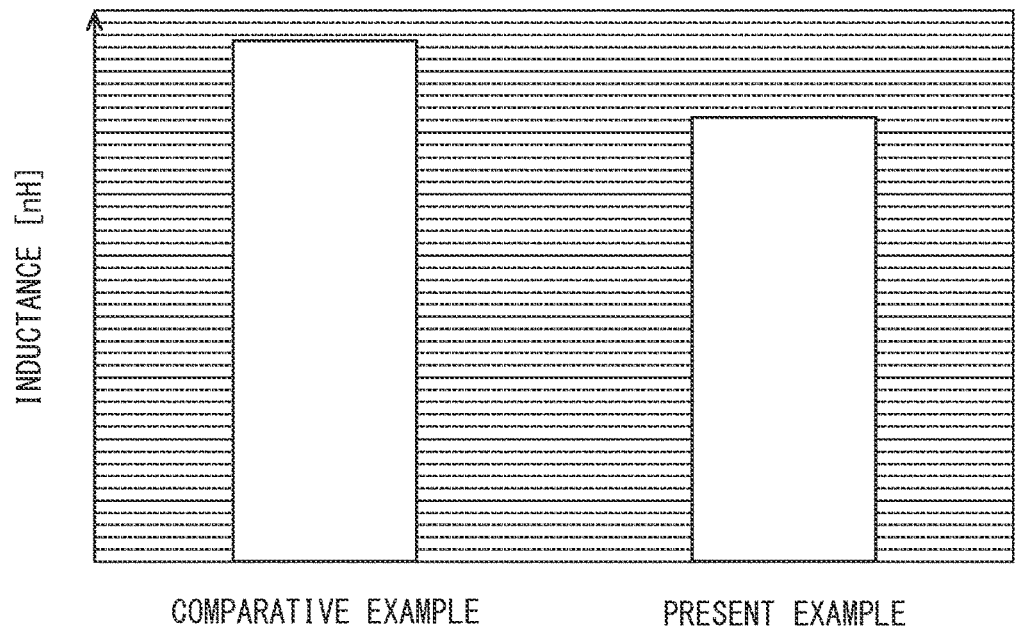
FIG. 11 is a diagram showing an inductance reduction.

On the other hand, in the present embodiment, the lead frame 60 including the main terminal 61 is provided as a member separate from the heat sink 50. The main terminal 61E is placed between the heat sink 50E and the semiconductor element 40, and is connected to the emitter electrode 41E. Thereby, as shown in FIG. 6, as the portion having the same potential as the emitter electrode 41E facing the heat sink 50C, the facing portion 64E of the main terminal 61E is closest. As the portion having the same potential as the emitter electrode, mainly, the main terminal 61E faces the heat sink 50C. A facing distance D1 between the facing portion 64E and the mounting surface 500C of the heat sink 50C is shorter than the above facing distance Dr. Thereby, it is possible to enhance the effect of canceling the magnetic flux as compared with the comparative example. As the result, as shown in FIG. 11, it is possible to further reduce the inductance as compared with the comparative example. FIG. 11 shows results obtained by magnetic field analysis (simulation) of the inductances of the heat sink 50C (50Cr) and the facing portion on the emitter potential side.

Further, the main terminal 610 (extension portion 63C) and the non-facing portion 65E of the main terminal 61E are alternately placed. The side surfaces 610C and 610E of the adjacent main terminal 61C and the adjacent non-facing portion 65E face each other. At the main terminal 61C and the non-facing portion 65E, the directions of the main currents are substantially opposite. Thereby, the magnetic fluxes generated when the main current flows cancel each other, and the inductance can be reduced. However, the side surface is smaller than the plate surface. Therefore, the lead frame 60 has multiple sets of facing side surfaces 610C and 610E. Accordingly, it is possible to effectively reduce the inductance. Further, multiple main terminal 61C and non-facing portions 65E of the same type are provided in parallel. This also makes it possible to reduce the inductance.

As described above, according to the semiconductor device 20 of the present embodiment, it is possible to reduce the inductance.

Figure 12:
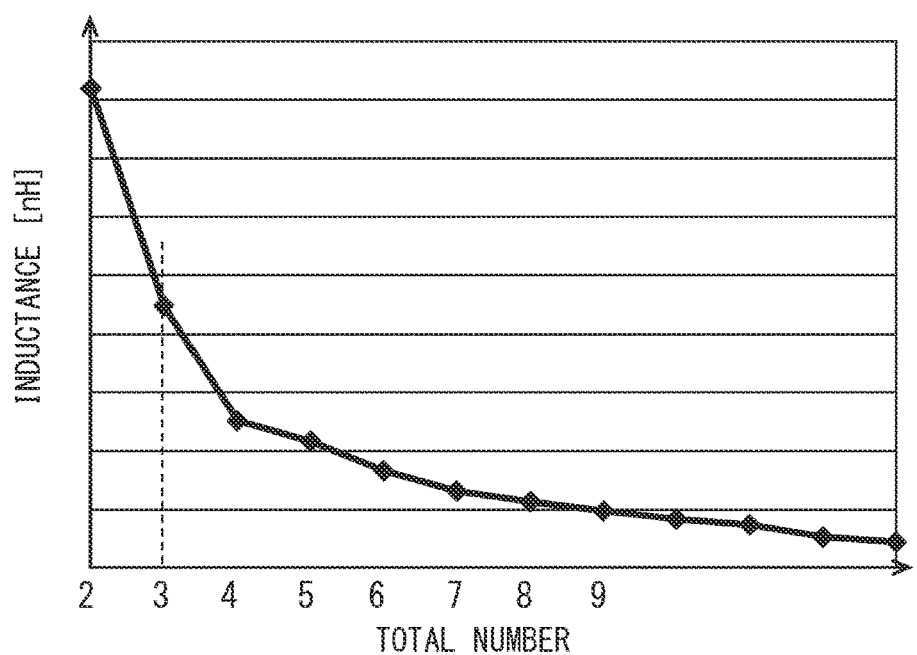
FIG. 12 is a diagram showing an inductance reduction.

FIG. 12 is a diagram showing an effect due to multiple sets of facing side surfaces 610C and 610E. FIG. 12 is a magnetic field analysis result showing a relationship between the total number of terminal portions of the main terminals 61 and the inductance. The terminal portion is, as described above, a portion provided as connection, in the main terminal 61, with the outside. The lead frame 60 includes, as the terminal portion, the extension portion 63C of the main terminal 61C and the non-facing portion 65E of the main terminal 61E.

The reference is a configuration including two terminal portions, that is, one main terminal 61C and one non-facing portion 65E. As shown in FIG. 12, when the total number of terminal portions is three or more, it is possible to further reduce the inductance as compared with a configuration where the total number is two. In the present embodiment, since, at least, either the number of main terminals 61C or the number of non-facing portions 65E is two or more, it is possible to reduce the inductance. Further, it is clear that the inductance can be reduced as the number of terminal portions is increased. In the present embodiment, four main terminals 61C and five non-facing portions 65E of the main terminals 61E are provided. Accordingly, it is possible to effectively reduce the inductance.

Figure 13:
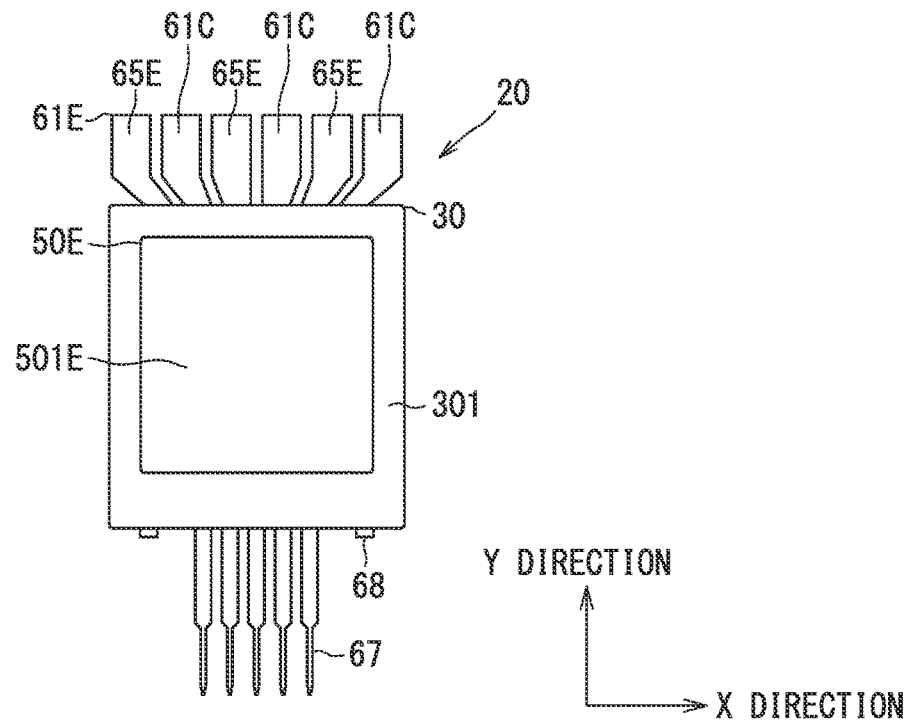
FIG. 13 is a plan view showing a modification.

The configuration of the main terminal 61 is not limited to the example having four main terminals 61C and five non-facing portions 65E of the main terminals 61E. The number of main terminals 61C may be larger than the number of the main terminals 61E (non-facing portions 65E). For example, the number of main terminals 61C may be five, and the number of non-facing portions 65E may be four. In this case, the main terminals 61C are arranged at both ends in the alignment direction. The total number of terminal portions is not limited to an odd number. It may be an even number. In a modification shown in FIG. 13, there are three main terminals 61C and three non-facing portions 65E, for a total of six.

Figure 14:
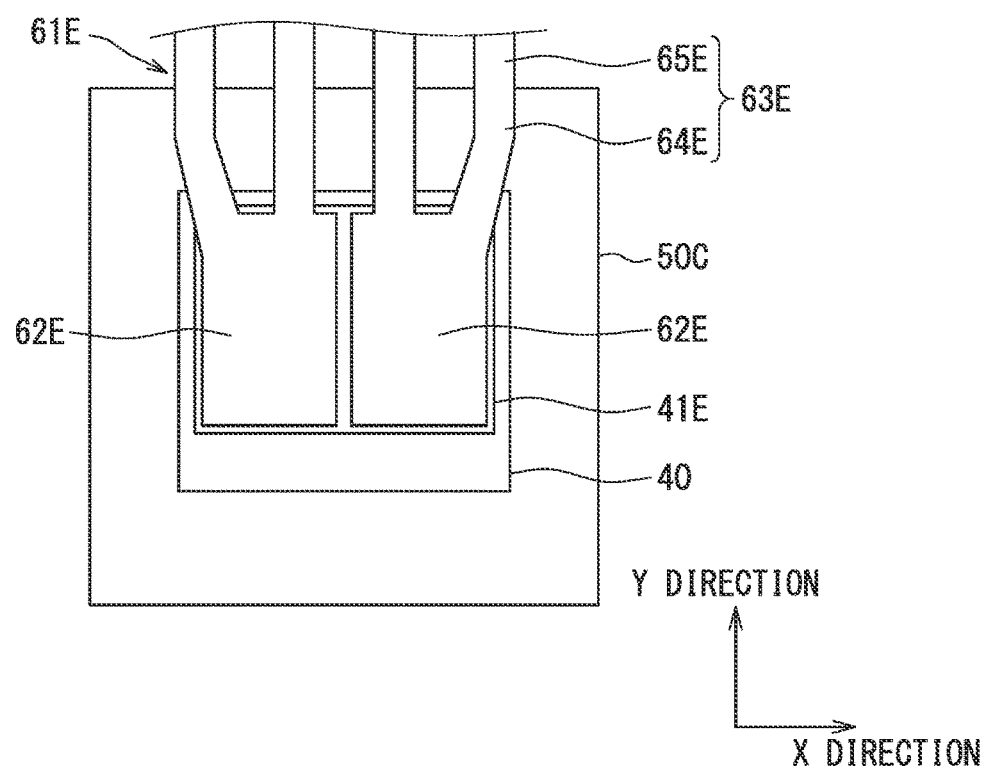
FIG. 14 is a schematic plan view showing the modification.

The main terminal 61E may include multiple connection portions 62E. For example, when the number of connection portions 62E and the number of non-facing portions 65E are same, the main terminal 61E has an independent structure one by one, similarly to the main terminal 61C. In a modification shown in FIG. 14, the main terminal 61E includes four non-facing portions 65E. The main terminal 61E includes two connection portions 62E, and two extension portions 63E extend from each connection portion 62E. The two connection portions 62E are arranged in the X direction, and, in this arrangement state, are connected to the emitter electrode 41E of the semiconductor element 40.

On the other hand, the main terminal 61E includes one connection portion 62E. Since the number of connection portions 62E is one, the emitter electrode 41E of the semiconductor element 40 is easily positioned. When one connection portion 62E is positioned, all the facing portions 64E have the desired positional relationship with respect to the heat sink 50C. Thereby, it is possible to effectively reduce the inductance. Further, as compared with the configuration in which the connection portion 62E is divided in multiple portions, it is possible to reduce the heat resistance in a heat transfer path from the emitter electrode 41E to the heat sink 50E. Furthermore, it is possible to improve the productivity.

The connection portion 62E of the lead frame 60 may be subjected to a treatment for improving wettability, such as Au plating. For example, by applying Au plating to a surface close to the semiconductor element 40, the semiconductor element 40 is self-aligned with respect to the lead frame 60. Thereby, it is possible to simplify the manufacturing process.

Although not shown, the signal terminal 67 may be electrically connected to the pad 42 of the semiconductor element 40 via a bonding wire. In this case, by making the plate thickness of the lead frame 60 thick, the height of the bonding wire is increased. However, since the facing portion 64E is close to the mounting surface 500C of the heat sink 50C, it is possible to further reduce the inductance as compared with the above comparative example.

Figure 15:
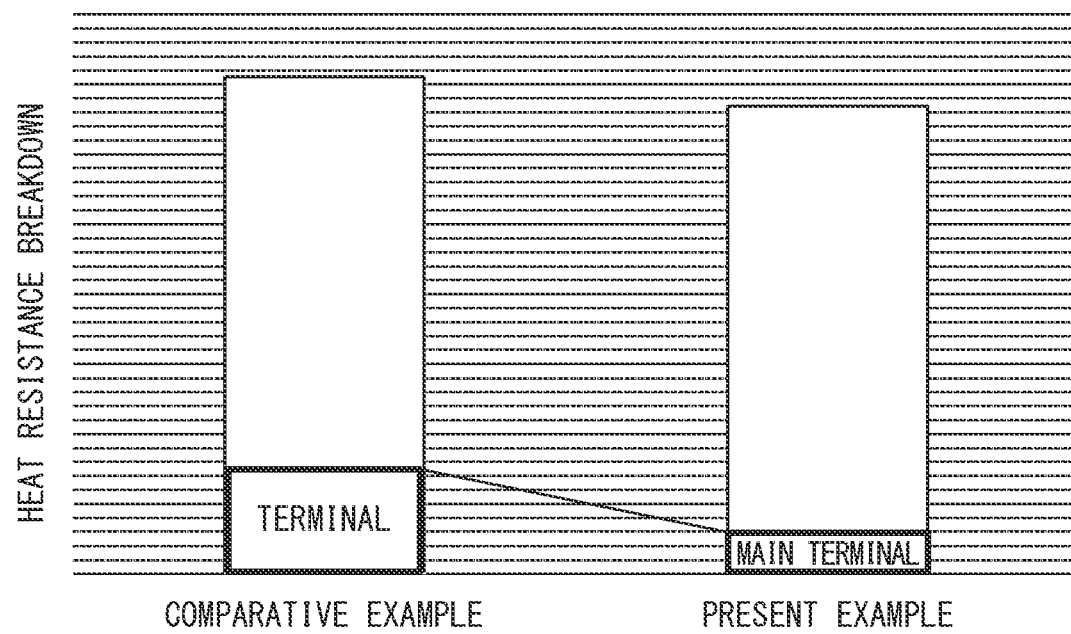
FIG. 15 is a diagram showing a heat resistance reduction.

On the other hand, in this embodiment, the signal terminal 67 is connected to the pad 42 via a joint member 83. The semiconductor device 20 has a bondingless structure. It is not necessary to secure the height of the bonding wire between the semiconductor element 40 and the heat sink 50E. Since the lead frame 60 is thin, the distance from the emitter electrode 41E to the heat sink 50E can be shortened as compared with the comparative example. Accordingly, as shown in FIG. 15, it is possible to reduce the heat resistance as compared with the comparative example. That is, it is possible to improve the heat dissipation.

Since the lead frame 60 is thin, as shown in FIG. 6, a facing distance D2 between the mounting surfaces 500C and 500E is shorter than the facing distance Dr of the reference example. Accordingly, the size of the semiconductor device 20 can be reduced in the Z direction. Further, since the bonding wire is not necessary, the joint members 80, 81, 82, and 83 can be reflowed all at once. Thereby, it is possible to simplify the manufacturing process. FIG. 15 shows a result of thermal analysis (simulation).

The connection position of the main terminal 61C with respect to the heat sink 50C is not particularly limited. For example, the main terminal 61C may be connected to the side surface of the heat sink 50C. In the present embodiment, the heat sink 50C is longer than the heat sink 50E in the Y direction. Thereby, the heat sink 50C includes the overlapping portion 51C and the non-overlapping portion 52C. The connection portion 62C of the main terminal 61C is connected to the non-overlapping portion 52C of the mounting surface 500C of the heat sink 50C. Accordingly, after the reflow, the main terminal 61C can be connected to the heat sink 50C. The connection method that does not use the joint member such as solder can be employed. It is possible to prevent the occurrence of the electromigration.

In the present embodiment, the main terminals 61C and 61E are placed line-symmetrically with respect to the center line CL of the semiconductor element 40 in the X direction. Thereby, the main current flows so as to be line-symmetric with respect to the center line CL. The main current flows almost evenly on the left side and the right side with respect to the center line CL. Thereby, it may be possible to reduce the inductance. In addition, it may be possible to suppress local heat generation.

Second Embodiment

This embodiment is a modification of a basic aspect of the preceding embodiment. In the above embodiment, the facing portion 64E of the main terminal 61E is completely separated for each non-facing portion 65E. Instead of this, at least a part of the facing portion 64E may be integrated by multiple non-facing portions 65E.

Figure 16:
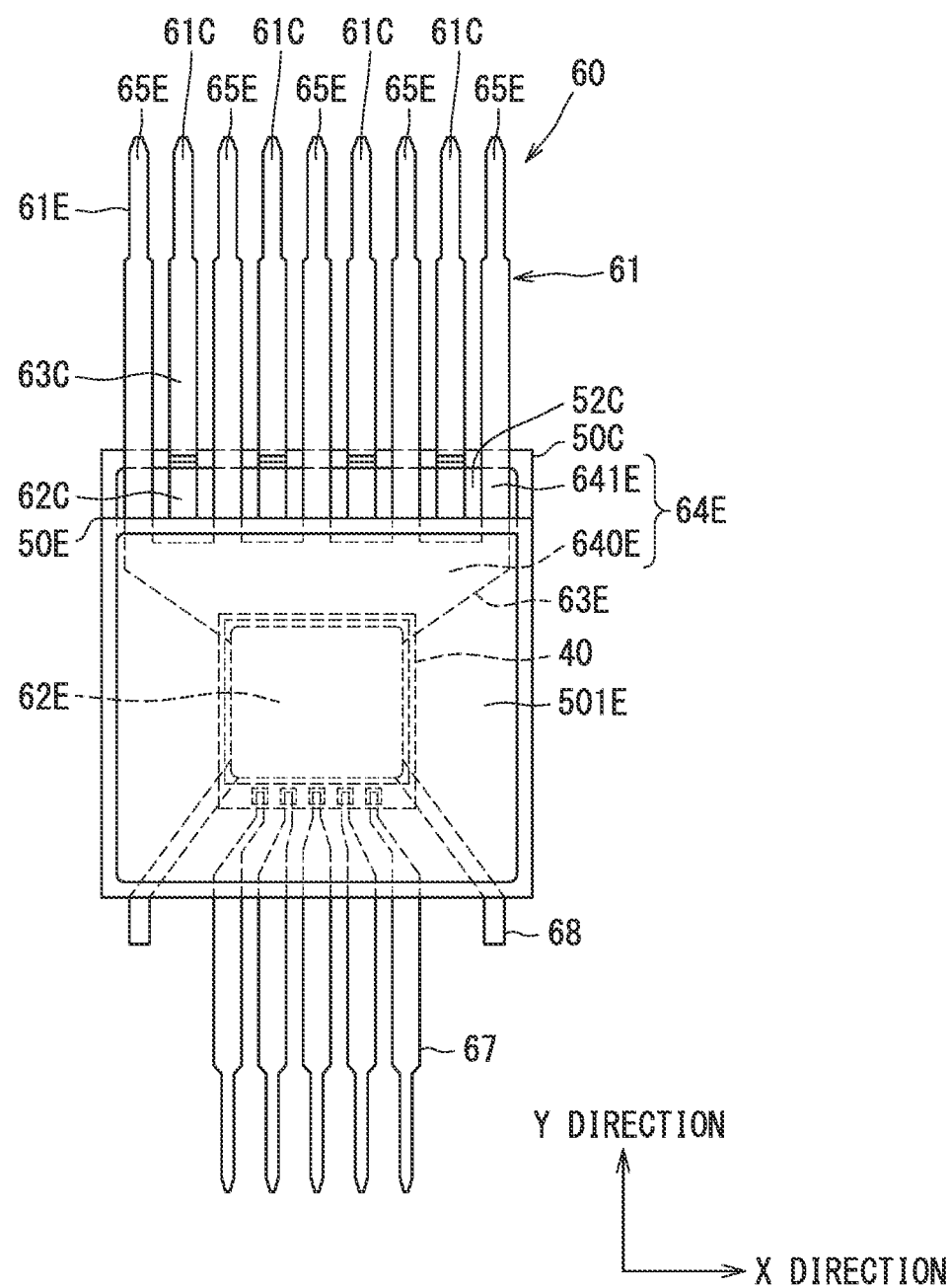
FIG. 16 is a plan view showing a semiconductor device according to a second embodiment and corresponding to FIG. 5.

FIG. 16 is a diagram showing the semiconductor device 20 of the present embodiment, and corresponds to FIG. 5. Similarly to FIG. 5, for convenience, the sealing resin body 30 is omitted. The main terminal 61E includes, as the facing portion 64E, a common portion 640E and a branch portion 641E. The main terminal 61E includes one connection portion 62E similarly to the preceding embodiment. The common portion 640E is connected to the connection portion 62E. The common portion 640E is placed at a root portion close to the connection portion 62E in the extension portion 63E. In the extending direction of the extension portion 63E, a portion within a predetermined area from the connection portion 62E is defined as the common portion 640E.

The common portion 640E is shared by multiple non-facing portions 65E. The common portion 640E extends form the connection portion 62E in the Y direction without being divided into the multiple portions. The common portion 640E is provided so as not to interfere the connection between the main terminal 61C and the heat sink 50C. Similarly to the preceding embodiment, the connection portion 62C is connected to the non-overlapping portion 52C that is the mounting surface 500C of the heat sink 50C. The common portion 640E is placed within a range overlapping with the heat sink 50E in the plan view from the Z direction. The common portion 640E faces the overlapping portion 51C of the heat sink 50C.

The branch portions 641E are portions branched from the common portion 640E. The branch portions 641E connects the common portion 640E and the non-facing portion 65E. The number of branch portions 641E is same as the number of non-facing portions 65E. The branch portion 641E extends along the Y direction integrally with the corresponding non-facing portion 65E. The branch portion 641E faces, at least, the non-overlapping portion 52C of the heat sink 50C.

Overview of Second Embodiment

In the present embodiment, the main terminal 61E includes, as the facing portion 64E, the common portion 640E. Accordingly, as described in the preceding embodiment, as compared with the configuration that does not include the common portion 640E, the area along the XY plane of the main terminal 61E is expanded. Thereby, the areas facing the heat sink 50C and the main terminal 61E are increased, and it is possible to reduce the inductance.

Further, it is possible to reduce the heat resistance. Thereby, it is possible to improve the heat dissipation.

The common portion 640E may be placed as a part of the facing portion 64E in the extending direction of the extension portion 63E. For example, the common portion 640E may be placed at a portion away from the connection portion 62E. In the present embodiment, the common portion 640E is connected to the connection portion 62E. That is, the area of the main terminal 61E is expanded in the vicinity of the emitter electrode 41E. Thereby, it is possible to further improve the heat dissipation.

Third Embodiment

This embodiment is a modification of a basic aspect of the preceding embodiment. In the above embodiment, the thickness of the lead frame 60 is substantially constant over the entire area. Instead of this, the thickness of the lead frame 60 may be partially different. A modified lead frame 60 may be used.

Figure 17:
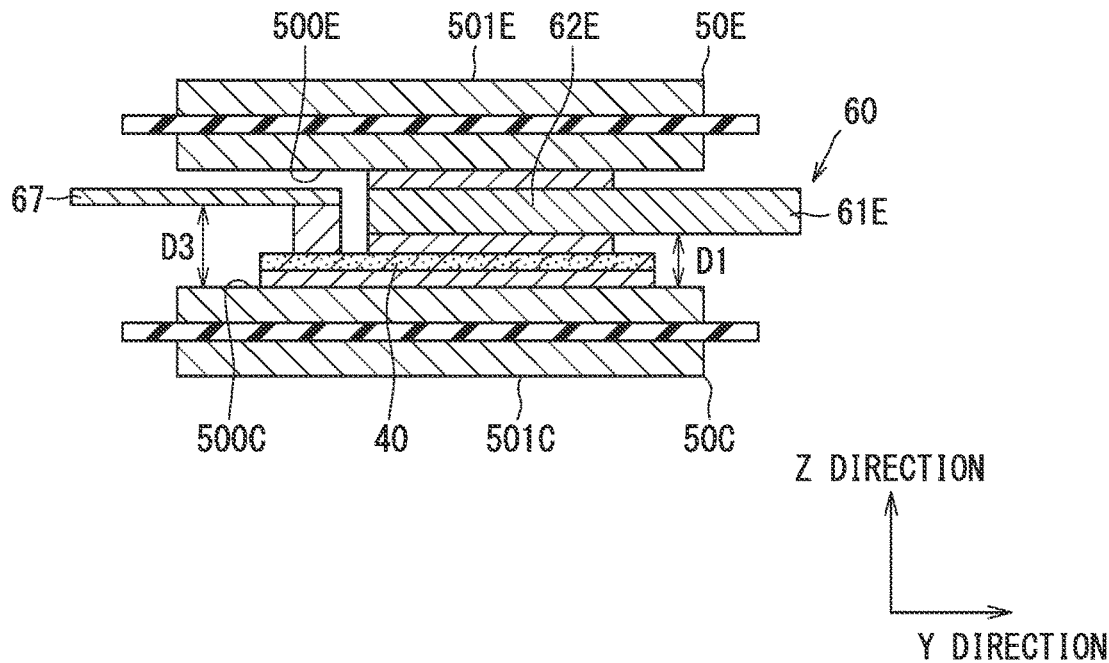
FIG. 17 is a cross-sectional view showing the periphery of a semiconductor element in a semiconductor device according to a third embodiment.

FIG. 17 is a cross-sectional view showing a periphery of the semiconductor element 40 in the semiconductor device 20 of the present embodiment. In FIG. 17, for convenience, the sealing resin body 30, the main electrode 41, and the pad are omitted. As shown in FIG. 17, in the lead frame 60, the signal terminal 67 is thinner than the main terminal 61E. A facing distance D3 between the signal terminal 67 and the mounting surface 500C of the heat sink 50C is longer than the facing distance D1 between the main terminal 61E and the mounting surface 500C. In the lead frame 60, the signal terminal 67 is a thin portion, and the other is a thick portion. In the signal terminal 67, the plate surface close to the heat sink 50E is substantially flush with the main terminal 61E.

Overview of Third Embodiment

In the present embodiment, the signal terminal 67 of the lead frame 60 is locally thinned. Thereby, it is possible to secure the electrical insulation between the heat sink 50C connected to the collector electrode 41C and the signal terminal 67. In such a manner, by employing an uneven lead frame 60 having, it is possible to secure the insulation property between different potentials.

Figure 18:
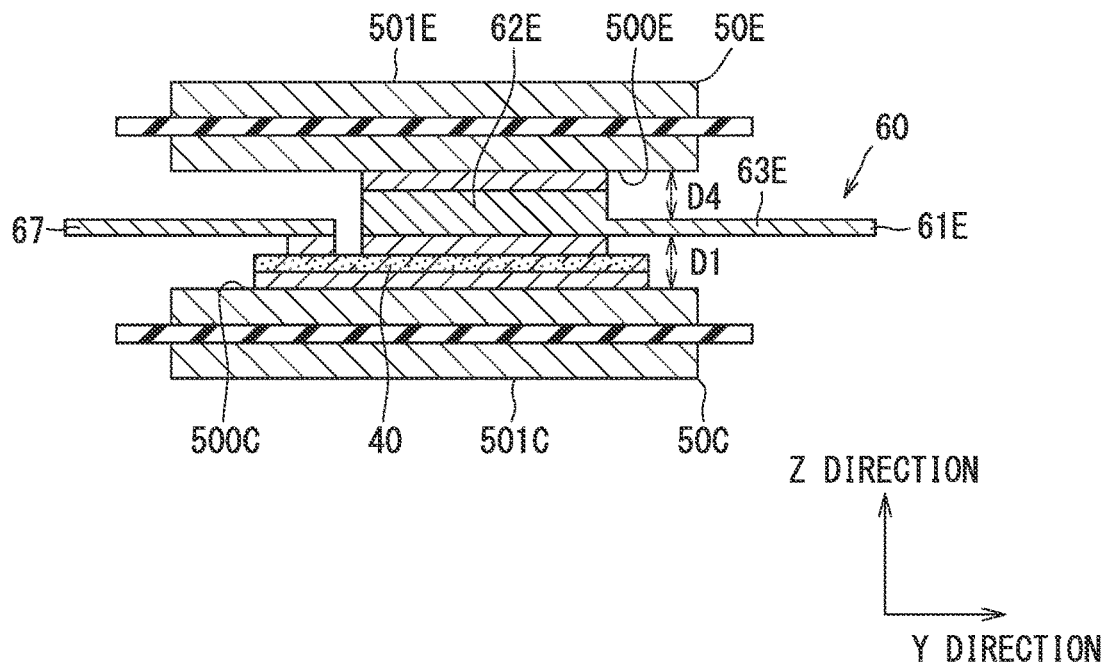
FIG. 18 is a cross-sectional view showing the modification.

The uneven lead frame 60 is not limited to the above example. For example, as in a modification shown in FIG. 18, in the lead frame 60, the connection portion 62E of the main terminal 61E may be locally thickened. In the lead frame 60, the connection portion 62E is a thick portion, and the other is a thin portion. The plate surface close to the semiconductor element 40 in the connection portion 62E is substantially flush with the extension portion 63E and the like.

Thereby, a facing distance D4 between the lead frame 60 and the mounting surface 500E of the heat sink 50E can be made longer than that of the example shown in the preceding embodiments. Accordingly, when the sealing resin body 30 is molded, the resin easily flows between the lead frame 60 and the mounting surface 500E. Thereby, it is possible to avoid molding defects of the sealing resin body 30 while achieving the effect of reducing the inductance. It can also be applied to a configuration in which the signal terminal 67 is connected to the pad 42 via the bonding wire.

The plate surface close to the heat sink 50E in the connection portion 62E may be substantially flush with the extension portion 63E and the like. In this case, although the main terminal 61E is away from the mounting surface 500C, it is possible to reduce the inductance as compared with the above comparative example. Further, the resin easily flows between the lead frame 60 and the mounting surface 500C.

Other Embodiments

Although an example in which the semiconductor device 20 is applied to the inverter 5 has been described, the present embodiment is not limited to the above example. For example, the present embodiment may be applied to a converter. The present embodiment may also be applied to both the inverter 5 and the converter.

The example in which the IGBT 6i and the FWD 6d are formed on the semiconductor element 40 has been shown. However, it is not limited to this. The FWD 6d may be used as a separate chip.

The example in which the IGBT 6i is shown as the switching element has been shown. However, it is not limited to this. For example, a MOSFET can be employed.

The example in which the heat dissipation surfaces 501C and 501E are exposed from the sealing resin body 30 has been shown. However, it is not limited to this. At least one of the heat dissipation surfaces 501C and 501E may be covered with the sealing resin body 30. The heat dissipation surfaces 501C and 501E may be covered with an insulating member (not shown) different from the sealing resin body 30.

Although not shown, a through hole may be provided in the lead frame 60 at a portion facing the heat sink 50. Thereby, it is possible to avoid molding defects. A through hole may be provided in the main terminal 61. For example, it may be provided in the common portion 640E. The through hole may be provided in the signal terminal 67. The through hole may be provided in the suspension lead 68.

In the above, the embodiments, the configurations, the aspects of the semiconductor device according to the present disclosure are exemplified. The present disclosure is not limited to the above-described embodiments, each configuration and each aspect related to the present disclosure. For example, embodiments, configurations, and examples obtained from an appropriate combination of technical elements disclosed in different embodiments, configurations, and examples are also included within the scope of the embodiments, configurations, and examples of the present disclosure.

What is claimed is:
1. A semiconductor device comprising:
 a semiconductor element having one surface and a back surface opposite to the one surface in a thickness direction of the semiconductor element, the semiconductor element including a first main electrode placed on the one surface and a second main electrode placed on the back surface;
 a first heat dissipation member and a second heat dissipation member placed to sandwich the semiconductor element, the first heat dissipation member placed close to the one surface and connected to the first main electrode, the second heat dissipation member placed close to the back surface; and
 a lead frame including at least one first main terminal electrically connected to the first heat dissipation member and a second main terminal connected to the second main electrode, wherein
 the second main terminal includes a connection portion, a facing portion, and at least one non-facing portion,
 the connection portion is connected with the second main electrode;

the facing portion extends from the connection portion, has a first end continuous from the connection portion and a second end continuous from the at least one non-facing portion, and faces the first heat dissipation member, the at least one non-facing portion and the at least one first main terminal are arranged in a direction orthogonal to the thickness direction, the second heat dissipation member is connected to the semiconductor element via the second main terminal, in the lead frame, the at least one first main terminal includes a plurality of first main terminals or the at least one non-facing portion of the second main terminal includes a plurality of non-facing portions, and the at least one first main terminal and the at least one non-facing portion of the second main terminal are alternately arranged in such a manner that a side surface of one of the at least one first main terminal faces a side surface of adjacent one of the at least one non-facing portion of the second main terminal to form a plurality of pairs of the side surfaces that face each other.

2. The semiconductor device according to claim 1, wherein
the second main terminal includes the plurality of non-facing portions and the connection portion integrally provided with the plurality of non-facing portions.

3. The semiconductor device according to claim 2, wherein
the facing portion is integrally provided with the plurality of non-facing portions in at least a part of a range in an extension direction in which the facing portion extends from the connection portion.

4. The semiconductor device according to claim 1, wherein
the semiconductor element further includes a signal pad formed on the back surface, and
the lead frame further includes a signal terminal electrically connected to the pad.

5. The semiconductor device according to claim 4, wherein
the signal terminal is connected to the pad via a joint member.

6. The semiconductor device according to claim 5, wherein
in the lead frame, the signal terminal is thinner than the second main terminal, and
a facing distance between the signal terminal and the first heat dissipation member is longer than a facing distance between the second main terminal and the first heat dissipation member.

7. The semiconductor device according to claim 1, wherein
the first heat dissipation member includes an overlapping portion that overlaps with the second heat dissipation member in a plan view from the thickness direction and a non-overlapping portion that is continuous from the overlapping portion and does not overlap with the second heat dissipation member, and
the first main terminal is connected to the non-overlapping portion of a facing surface of the first heat dissipation member, the facing surface facing the second heat dissipation member.

* * * * *